United States Patent [19]

Wright

[11] Patent Number: 5,138,254

[45] Date of Patent: Aug. 11, 1992

[54] REMOVABLE ALTERNATING CURRENT MEASURING CIRCUIT

[76] Inventor: Charles S. Wright, 7901 Jansen Ct., Springfield, Va. 22152

[21] Appl. No.: 294,291

[22] Filed: Jan. 6, 1989

[51] Int. Cl.$^5$ .................... G01R 19/22; H04B 17/00
[52] U.S. Cl. .................................. 324/119; 324/95; 324/127; 455/115
[58] Field of Search .................. 324/119, 127, 123 C, 324/95; 455/67, 115

[56] References Cited

U.S. PATENT DOCUMENTS

| | | |
|---|---|---|
| 977,061 | 11/1910 | Wiler . |
| 1,887,421 | 11/1932 | Newman . |
| 2,134,589 | 10/1938 | Stanek . |
| 2,231,737 | 2/1941 | Rutter . |
| 2,238,298 | 4/1941 | Wehrlin . |
| 2,905,899 | 9/1959 | Miller et al. ............. 324/119 |
| 3,311,826 | 3/1967 | Galman ............. 324/123 C |
| 3,914,689 | 10/1975 | Wright . |

FOREIGN PATENT DOCUMENTS 959388 3/1957 Fed. Rep. of Germany ...... 324/119

Primary Examiner—Ernest F. Karlsen
Attorney, Agent, or Firm—Welsh & Katz, Ltd.

[57] ABSTRACT

A removable alternating current measuring circuit provides for measuring radio frequency currents produced in an AM transmitter-antenna system without draining any power from the system. A transformer couples the transmitter-antenna system with the current measuring circuit, which includes a first and second half wave circuits for operation during the positive and negative half cycles of alternating current. During the positive half cycle, a first diode directs current through a first load resistor and through a series combination including a second load resistor and a direct current meter. During the negative half cycle, a second diode in opposition to the first diode directs current through the second load resistor and through a series combination including the first load resistor and the current meter. Current always flows through the meter in the same direction. The component values are chosen so that the current measured is independent of diode offset characteristics or temperature variation without extracting any power from the transmitter-antenna system.

10 Claims, 2 Drawing Sheets

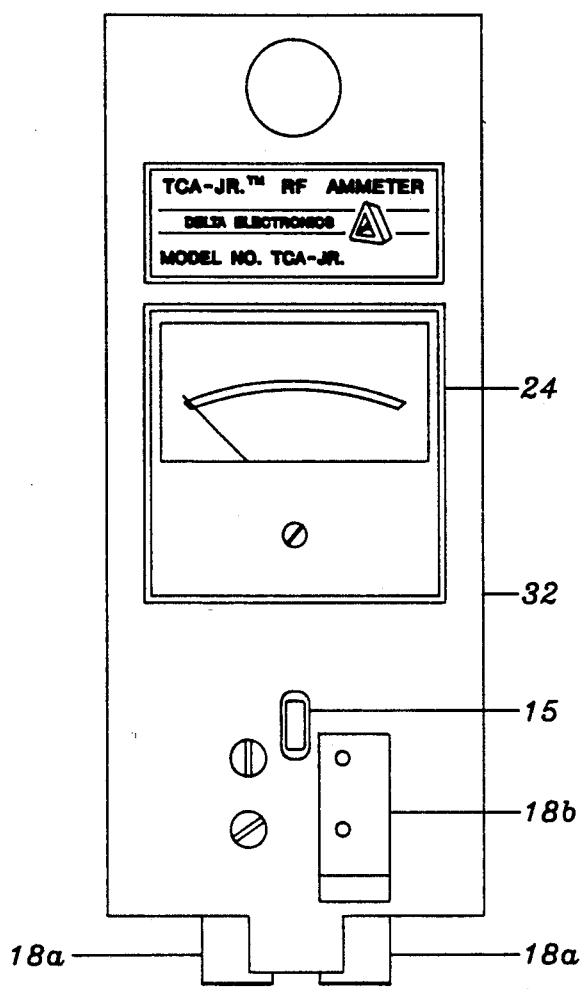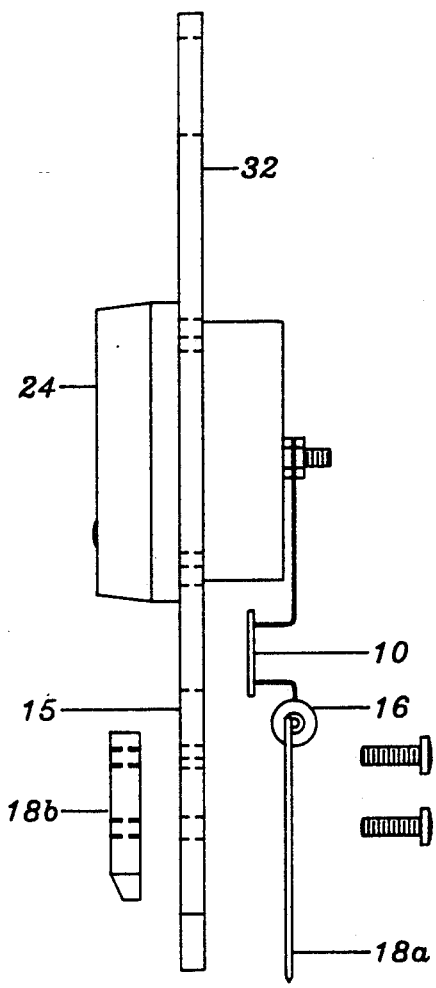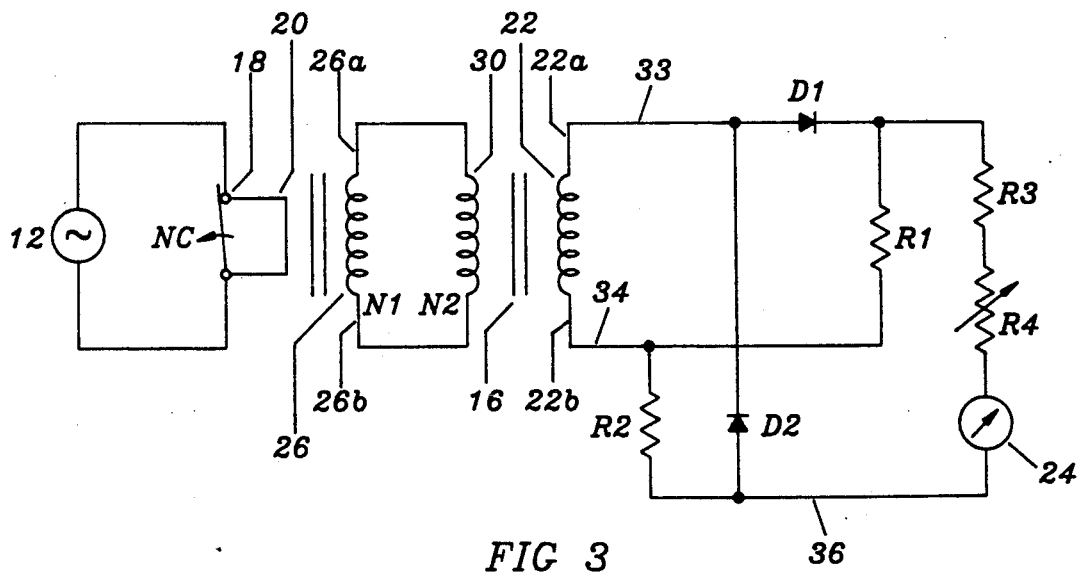
FIG 4
FIG 5
FIG 3

REMOVABLE ALTERNATING CURRENT MEASURING CIRCUIT

FIELD OF THE INVENTION

The invention relates to a device for measuring alternating currents. In particular, the current measuring device is for use in measuring radio frequency currents in a transmitter-antenna system. The present invention is designed to minimize power drawn from the system producing the current to be measured while being easily removed from the system when not in use.

BACKGROUND OF THE INVENTION

Meters for measuring radio frequency currents have been proposed in the past. It is desirable to measure the current generated in a transmitter-antenna system in order to determine the power dissipated therein to conform with F.C.C. requirements. U.S. Pat. No. 2,134,589 to J. Stanek provides an early teaching of measuring alternating current with the use of a single wound primary passing through a secondary winding. Stanek, however, teaches a circuit which compensates for the impedance of the rectifier placed therein. The present invention, on the other hand, comprises a simple circuit which relies on the characteristic of a current transformer to overcome the effects of rectifying diodes.

U.S. Pat. No. 2,238,298 to H. Wehrlin also teaches a high frequency current measuring device using a single primary winding, a toroidal transformer, and an analog meter. Similarly, Wehrlin does not teach a rectification circuit to provide compensation for temperature variation and the like.

The transmitter-antenna system does not function in a controlled environment. The current metering device should compensate for temperature variation while not introducing additional impedance to the transmitter-antenna system. U.S. Pat. No. 3,914,689 to C. Wright teaches a self-powering temperature compensated rectifier for measuring alternating current which utilizes a first, second, and third diode to compensate for the diode offset voltage. The diode offset voltage is overcome by placing the second compensating diode in opposition with the first diode, the second compensating having current supplied to it by the third diode. This circuit, however, does not function at low signal levels because the offset of the third diode is prevented from supplying current to the compensating diode. The need, therefore, arose for ammeters of a lower full scale range. Therefore, the present invention evolved to provide a different rectifier circuit to accommodate these lower ranges.

SUMMARY OF THE INVENTION

The present invention provides a removable current measuring circuit for use in measuring radio frequency current.

In accordance with one illustrative embodiment, the current measuring circuit operates as a first and a second half wave circuit for the positive and negative half cycle of the alternating current respectively. When operating in the first half wave circuit, a first current gate is used to direct alternating current through a first load resistor and current metering output in parallel combination with the first load resistor on the positive half cycle of the alternating current. A diode of the silicon family may illustratively be used as the current gate. When operating in the second half wave circuit, a second current gate is placed in opposition to the first current gate and directs current through a second load resistor and current metering output in parallel combination with the second load resistor on the negative half cycle. The resistance of the second load resistor is substantially the same as the first load resistor. Current always flows through the current metering output in the same direction for the positive and negative half cycles.

An important feature of the invention relates to the use of a transformer which is coupled to the source of alternating current to be measured. The inductive reactance of the transformer is quite large in relation to the load resistance values. In addition, the transformer achieves a coupling efficiency of near unity. Thus, the transformer acts as an ideal current source. The voltage across the output of the transformer changes quite rapidly as the current changes from the negative half cycle to the positive half cycle, enabling the first and second diodes to conduct. Therefore, temperature variations and diode characteristic variations only slightly effect the switching of the diodes and have neglible influence on the output current measured by the meter.

Another important feature of the invention is that the circuit is removable from the transmitter-antenna system to minimize risk of lightning damage and the like. Contact means are used to allow the measuring circuit to be easily inserted and removed from the system when not in use. The contact means include bar contacts placed on either side of a circuit mounting board which slidably engages in a cantilevered normally closed contact. The contact means further includes a pair of parallel contact strips which slidably insert into a J-plug receptacle. Further, the transformer which includes a single conductor primary is placed between the parallel contact strips to reduce the insertion impedance. Thus, the measuring device can be easily adapted to engage in commercially available transmitter-antenna systems.

Another important specific feature of the invention is that an auxiliary toroid may be placed between the system and the measuring circuit. The auxiliary toroid acts as a current divider for measuring higher current scales.

BRIEF DESCRIPTION OF THE DRAWINGS

For a more complete understanding of the invention, reference should now be made to the following drawings showing the embodiments in greater detail and described by way of example:

FIG. 3 is a schematic wiring diagram showing the present invention with the use of an auxiliary toroid for further current reduction;

FIG. 4 is a front view of the present invention showing the arrangement of the contact mechanism being adapted for use in commercially available systems; and FIG. 5 shows an expanded, side view of the contact mechanism of the present invention.

DESCRIPTION OF THE PREFERRED EMBODIMENT

Figure 1:
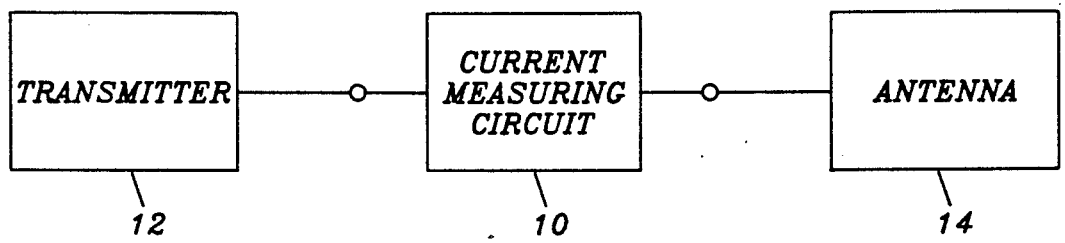
FIG. 1 is a block diagram showing the placement of the present invention in a transmitter-antenna system.

FIG. 1 illustrates a removable circuit 10 for measuring alternating current in an AM transmitter-antenna system utilizing the present invention. The current measuring circuit 10 is placed in series between a source of alternating current, the transmitter 12, and the antenna 14.

The current measuring circuit 10 converts alternating current sent from the transmitter 12 to the antenna 14 to a rectified waveform from which the DC component can be measured. It is desirable to measure the DC component of alternating current to calculate the power sent through the antenna 14, which, of course, is a function of the load of the antenna 14. It is desirable that the alternating current flowing to the antenna 14 should be unaffected by the presence of the current measuring circuit 10.

Figure 2:
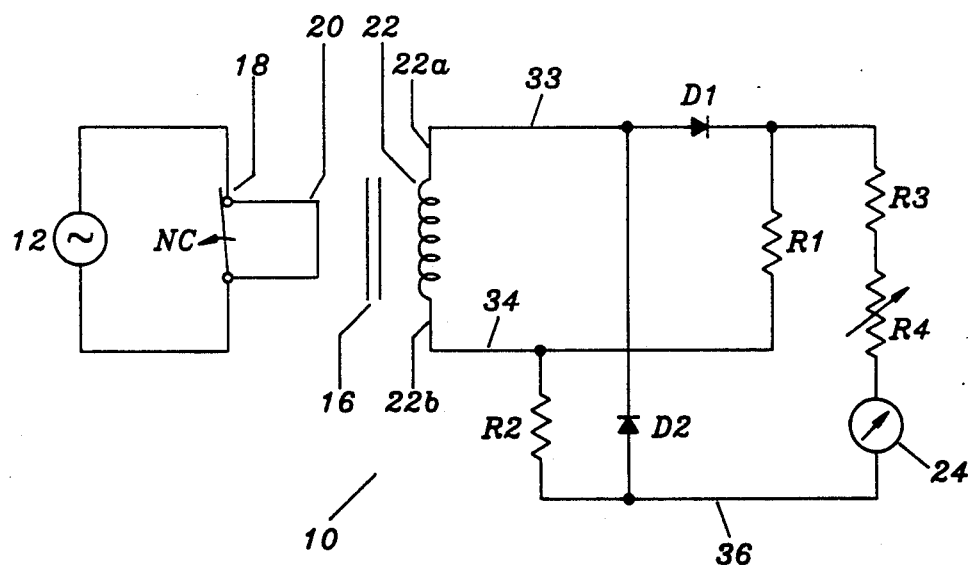
FIG. 2 is a schematic wiring diagram showing the present invention with a toroidal transformer, two diodes and the various resistances of the rectifier circuit with the output fed to a metering means such as a direct current meter.

Referring now to FIG. 2, the current measuring circuit 10 is comprised of a transformer 16 which couples the current measuring circuit 10 with the transmitter-antenna system. The transformer 16 is characterized by a unitary conductor forming a primary winding 20 which is placed between a series contact means 18 of the current measuring circuit 10 in order to reduce the insertion impedance introduced by the current measuring circuit 10. The primary winding 20, a single length of wire in a preferred embodiment, passes through a secondary winding 22, which causes an alternating current to be produced at a pair of first and second terminals 22a, 22b of the secondary winding 22. The transformer 16 achieves a coupling efficiency of near unity. Thus, the transformer 16 acts as an ideal current source. The secondary winding 22 may further be characterized as having fifty turns and the alternating current produced by the transmitter 12 is reduced by a factor of fifty. An example of the transformer 16 used in the present invention is that manufactured by Delta Electronics, Inc. which is identified as Part No. D63-65, having a coupling efficiency of 0.998 and having a inductive reactance of approximately 6,400 ohm at 1 MHz.

The current measuring circuit 10 operates as first and second half wave circuits during the positive and negative half cycles of the alternating current. During the first half cycle, a first current gate, silicon diode D1, has an anode connected via a first lead 33 to the first terminal 22a of the secondary winding 22 and directs current through a first load resistor R1 on the positive half cycle of the alternating current. The resistance of the first load resistor R1 is substantially less than the inductive reactance of the transformer 16. The first load resistor R1 is connected between the cathode of the first diode D1 and a second lead 34, which in turn is connected to the second terminal 22b of the secondary winding 22. Current is also directed through a resistor R3, which has one terminal connected to the cathode of the first diode D1. The other terminal of resistor R3 is connected to one terminal of a variable resistor R4 which calibrates the rectifier circuit 10. The other terminal of resistor R4 forms an output of the current measuring circuit 10 which is connected to one terminal of a metering means or a direct current meter 24.

During the second half wave cycle or negative half cycle, a second diode D2 has its cathode connected by the first lead 33 to the terminal 22a of the secondary winding 22 and is opposed to the first diode D1. A second load resistor R2 is connected to the anode of the second diode D2 via a third lead 36 and is also connected via the second lead 34 to the second terminal 22b of the secondary winding 22. The resistance of the second resistor R2 is substantially equal to that of the first resistor R1. Current is directed through the second load resistor R2 on the negative half cycle of the alternating current imposed on the secondary winding 22. The current meter 24 has its other terminal connected to the anode of the second diode D2 via the third lead 36. The first and second diodes D1, D2 achieve full rectification of the alternating current so that the current directed through the direct current meter 24 is of the same polarity for both the positive and negative half cycles.

By way of illustrative example and not by way of limitation, the circuit components may have values, types or ratings as follows for a two ampere full scale measurement:

| Reference Numeral | Type, Value, Or Rating |
|---|---|
| 16 | .001 Henry |
| 22 | 50 turn winding |
| R1, R2 | 25 ohms |
| D1, D2 | Type 1N4148 |
| R3 | 7700 ohms |
| R4 | 1000 ohm 10 turn potentiometer |
| 24 | 100 microampere full scale DC meter |

The components are chosen so that the inductive reactance of the transformer 16 is quite large in relation to the resistance of the first and second load resistors R1, R2. Further, the transformer achieves a coefficient of coupling near unity. By setting the reactance of the transformer 16 much greater than the resistance of the first and second resistors R1, R2 as well as creating a large coupling coefficient, the transformer 16 acts as an ideal current source. As a result, the voltage between the first and second terminals 22a, 22b of the secondary winding 22 is able to change quite rapidly to overcome the diode offset voltages. The switching time of the diodes D1 and D2 at the contemplated RF frequencies of the transmitter 12 is relatively small and does not effect the meter reading.

The rectifier circuit 10 is essentially independent of the diode offset temperature characteristics. The effects of variations in resistor values can be mitigated by using resistors R1 and R2 of the same temperature coefficient as that of resistors R3 and R4. The current meter 24, of course, has a coil of copper wire, but its resistance is relatively small compared to that of resistor R3. If resistors R1, R2, R3 and R4 are stable resistors of low and similar temperature coefficient, there is little temperature effect. The ferrite permeability of the transformer 16 varies with temperature, but the only requirement on the inductance of the transformer 16 is that its reactance be large compared to the resistive loads of the circuit. The actual inductance can vary widely without effect. Tests have shown that the current measuring circuit 10 of this invention is remarkably independent of temperature.

The power drain of the rectifier circuit 10 is extremely small. It can be seen that by approximating the transformer 16 as ideal and by making the load impedance of the rectifier circuit small, for example 25 ohms (the resistance of the first load resistor R1 in parallel with the series combination of the second load resistor R2 and the third resistor R3 and the variable resistor R4), and by making the ratio of the number of windings of the secondary winding 22 to that of the primary winding 20 large, for example 50 to 1, the resulting load imposed on the contact means 18 of the rectifier circuit is quite small. This load is calculated as the impedance imposed on the secondary winding 22 divided by the turns ratio squared. From the illustrative impedance values set out above, 25 ohms is divided by 2500 to indicate a small load of only 0.01 ohm. It is readily apparent that the power dissipated by the current measuring circuit 10 is neglible when inserted into the transmitter-antenna system.

FIG. 3 shows the use of an auxiliary toroid 26 for further current reduction when measuring higher current produced by the alternating current source 12 wherein like characters are used to designate the corresponding circuit elements. The auxiliary toroid 26 is wound on a fertile core similar to the secondary winding 22, and the primary winding 20 passes through the auxiliary toroid 26. An auxiliary toroid wire 30 is connected to the auxiliary toroid via first and second terminals 26a, 26b of the auxiliary toroid 26. The auxiliary toroid wire 30 is passed through the secondary winding 22 which applies alternating current to the rectifier circuit 10.

If, for example, the meter 24 is calibrated for full scale deflection at two amperes, the auxiliary toroid 26 can produce further reduction of alternating current when a full scale reduction is desired. The auxiliary toroid 26 is wound with N1 equally spaced turns. The current carrying conductor 20 passes through it. The auxiliary toroid wire 30 is then passed through the secondary winding 22 N2 times and is connected between the first and second terminals 26a, 26b of the auxiliary toroid 26. Thus the auxiliary toroid 26 acts as a current divider. The number of turns N1 and N2 can be calculated using the unity coupling characteristic of the transformer and the auxiliary toroid 26. That is, the ampere turns of each winding must be the same. The following values for N1 and N2 were computed for various full scale meter sensitivity:

| Current | N1 | N2 |
|---------|----|----|
| 5 A | 5 | 2 |
| 10 A | 5 | 1 |
| 20 A | 20 | 2 |
| 40 A | 20 | 1 |

Of course, other values of N1 and N2 can be found for each current. For example, the auxiliary toroid 26 could have ten turns and the auxiliary toroid wire 30 could be passed through the secondary winding 22 two turns for a ten ampere full scale deflection of the meter 24. The maximum current passing through the auxiliary toroid 26 would be one ampere. Other variations of the ratio of the auxiliary toroid 26 to the number of turns of the auxiliary toroid wire 30 could achieve different full scale meter sensitivity.

As shown in FIG. 4 and FIG. 5, the contact means of the present invention is adapted to removably insert the rectifier circuit 10 into an existing transmitter-antenna system. The invention provides for bar contacts 18b which are mounted on either side of a mounting board 32. The bar contacts 18b form a series electrical connection with a cantilevered flexible contact arm, such as is described in a brochure by Delta Electronics, Inc. for their MJ-50 contacts. The invention also provides for a pair of parallel contact strips 18a for insertion into a commercially available J-plug receptacle. The mechanical construction also provides for the primary winding 20 and secondary winding 22 to be placed between the parallel contact strips 18a, further minimizing insertion impedance. As shown in FIGS. 4 and 5, the transformer 16 is mounted over a hole 15 in the mounting board 32 so that the current carrying conductor 20 can be passed through the transformer 16 after potting. A short length of the conductor 20 is connected between the two blade contacts 18a, whereby insertion losses are minimized. Therefore, the present invention is readily adaptable to easily insert into existing systems.

Lightning is also a serious consideration for broadcast engineers. By mounting the rectifier circuit 10 on the mounting board 32 and making it portable, the chance of damage due to lightning is dramatically reduced. The engineer inserts the board 32 into the system only for periodic measurement. This portability feature has other benefits as well. For directional arrays with comparable currents, only one rectifier circuit 10 is necessary. For the consultant or engineer, a single circuit 10 may be used for periodic power checks at several stations.

While a particular embodiment of the invention has been shown, it will be understood, of course, that the invention is not limited thereto since modifications may be made and other embodiments of the principles of this invention will occur to those skilled in the art to which this invention pertains, particularly upon considering the foregoing teachings.

For example, in FIG. 1, the transformer is shown by a primary conductor 14 which passes through a toroid 16. For a one ampere full scale meter, one could just as easily pass the primary conductor 14 through the toroid 16 two times.

Having described the invention, what is claimed is:

1. A current measuring circuit for measuring alternating current flowing along a conductor, current measuring circuit comprising:
   a) a transformer having a primary winding adapted to be coupled in circuit with the conductor, and a secondary winding with first and second terminals:
   b) meter means for providing an indication of the alternating current;
   c) first and second half wave circuits interconnecting said secondary winding and said meter means, and operative respectively during the positive and negative cycles of the alternating current for rectifying the alternating current and applying the rectified current in a common direction through said meter means;
   d) said first half wave circuit including a first current gate interconnected between said first terminal and said meter means, and operative to connect a first resistor in a first circuit path across said first and second terminals and to connect in series said meter means and a second resistor in a second circuit path between said first and second terminals;
   e) said second half wave circuit including a second current gate connected to said first terminal in a manner opposed to that of said first current gate, and operative to connect said second resistor in a third circuit path between said first and second terminals, and to connect in series said meter means and said first current gate in a fourth circuit path between said first and second terminals; and f) said first and second resistors having substantially the same resistance, said transformer having an inductive reactance at the frequencies of interest which is substantially greater than said same resistance, whereby changing operation between said first and second half wave circuits does not adversely affect the measurement of the rectified current by said meter means.

2. The current measuring circuit of claim 1, wherein said first and second current gates are diodes of the silicon family.

3. The current measuring circuit of claim 1, wherein said primary winding comprises a unitary winding.

4. The current measuring circuit of claim 1, wherein said primary winding is adapted to be coupled in circuit with the conductor via a removable contact means.

5. The current measuring circuit of claim 4, wherein said removable contact means comprises the combination of:
a) a mounting board;
b) a first pair of contact bars secured on one side of said mounting board;
c) a second pair of contacts disposed on the other side of said mounting board, corresponding ones of said first and said second pairs of contacts connected together;
d) said primary winding interconnected between said corresponding connected contacts of said first and second pairs.

6. The current measuring circuit of claim 1, wherein said transformer achieves a coupling coefficient of near unity.

7. The current measuring circuit of claim 1, wherein an auxiliary toroid is coupled with said transformer for further current reduction, said auxiliary toroid having a winding, said winding coupled with said primary and having a first and second terminals, said first and second terminals having an auxiliary conductor therebetween, said auxiliary conductor coupled with said secondary winding.

8. The current measuring circuit of claim 1, wherein said metering means comprises a direct current meter.

9. The current measuring circuit of claim 1, wherein said second circuit path and said fourth circuit path includes at least a third resistor.

10. The current measuring circuit of claim 9, wherein said third resistor has substantially greater resistance than said first resistor.

* * * * *